United States Patent
Khlat (10) Patent No.: US 11,031,911 B2
(45) Date of Patent: Jun. 8, 2021

(54) ENVELOPE TRACKING INTEGRATED CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 33 days.

(21) Appl. No.: 16/661,061

(22) Filed: Oct. 23, 2019

(65) Prior Publication Data
US 2020/0350865 A1    Nov. 5, 2020

Related U.S. Application Data (60) Provisional application No. 62/842,486, filed on May 2, 2019.

(51) Int. Cl.
| | | |
|---|---|---|
| *H03F 1/30* | (2006.01) | |
| *H03F 1/02* | (2006.01) | |
| *H03F 3/195* | (2006.01) | |
| *H03F 3/213* | (2006.01) | |

(52) U.S. Cl.
CPC .......... *H03F 1/0222* (2013.01); *H03F 1/301* (2013.01); *H03F 3/195* (2013.01); *H03F 3/213* (2013.01); *H03F 2200/102* (2013.01); *H03F 2200/504* (2013.01)

(58) Field of Classification Search
CPC ........................................................ H03F 1/30
USPC ......................................... 330/297, 296, 285
See application file for complete search history.

(56) References Cited

U.S. PATENT DOCUMENTS

| | | |
|---|---|---|
| 5,838,732 A | 11/1998 | Carney |
| 6,107,862 A | 8/2000 | Mukainakano et al. |
| 6,141,377 A | 10/2000 | Sharper et al. |
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 8,461,928 B2 | 6/2013 | Yahav et al. |

(Continued)

FOREIGN PATENT DOCUMENTS

EP    3174199 A2    5/2017

OTHER PUBLICATIONS

U.S. Appl. No. 16/354,234, filed Mar. 15, 2019.
(Continued)

*Primary Examiner* — Henry Choe
(74) *Attorney, Agent, or Firm* — Withrow & Terranova, P.L.L.C.

(57) ABSTRACT

An envelope tracking (ET) integrated circuit (IC) (ETIC) is provided. The ETIC is configured to generate an ET voltage based on a supply voltage(s) and provide the ET voltage to an amplifier circuit(s) for amplifying a radio frequency (RF) signal(s). Notably, the RF signal(s) may be modulated in different modulation bandwidths and the amplifier circuit(s) may correspond to different load-line impedances. Accordingly, the ETIC may need to adapt the ET voltage such that the ETIC and the amplifier circuit(s) can operate at higher efficiencies. In examples discussed herein, the ETIC is configured to determine a time-variant peak of the ET voltage and adjust the supply voltage(s) accordingly. As a result, it may be possible to improve operating efficiency of the ETIC in face of a wide range of bandwidth and/or load-line requirements.

20 Claims, 3 Drawing Sheets

(56) References Cited

U.S. PATENT DOCUMENTS

| | | |
|---|---|---|
| 8,493,141 B2 | 7/2013 | Khlat et al. |
| 8,519,788 B2 * | 8/2013 | Khlat .................... H02M 3/07 330/127 |
| 8,588,713 B2 | 11/2013 | Khlat |
| 8,718,188 B2 | 5/2014 | Balteanu et al. |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 * | 4/2017 | Krug .................. H03K 19/0013 |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,110,169 B2 | 10/2018 | Khesbak et al. |
| 10,158,329 B1 | 12/2018 | Khlat |
| 10,158,330 B1 * | 12/2018 | Khlat ..................... H03F 3/211 |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 2002/0167827 A1 | 11/2002 | Umeda et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0155836 A1 | 6/2015 | Midya et al. |
| 2015/0188432 A1 | 7/2015 | Vannorsdel et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222178 A1 | 7/2019 | Khlat et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0136561 A1 | 4/2020 | Khlat et al. |
| 2020/0136575 A1 | 4/2020 | Khlat et al. |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |

(56) References Cited

U.S. PATENT DOCUMENTS

| | | |
|---|---|---|
| 2020/0259456 A1 | 8/2020 | Khlat |
| 2020/0259685 A1 | 8/2020 | Khlat |
| 2020/0266766 A1 | 8/2020 | Khlat et al. |

OTHER PUBLICATIONS

U.S. Appl. No. 16/246,859, filed Jan. 14, 2019.
U.S. Appl. No. 16/180,887, filed Nov. 5, 2018.
U.S. Appl. No. 16/514,051, filed Jul. 17, 2019.
U.S. Appl. No. 16/435,940, filed Jun. 10, 2019.
U.S. Appl. No. 16/589,940, filed Oct. 1, 2019.
U.S. Appl. No. 16/590,790, filed Oct. 2, 2019.
U.S. Appl. No. 16/597,952, filed Oct. 10, 2019.
Non-Final Office Action for U.S. Appl. No. 16/122,611, dated Mar. 11, 2020, 16 pages.
Notice of Allowance for U.S. Appl. No. 15/888,300, dated Jan. 14, 2020, 11 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, dated Dec. 4, 2020, 8 pages.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Notice of Allowance for U.S. Appl. No. 16/354,234, dated Apr. 24, 2020, 9 pages.
Final Office Action for U.S. Appl. No. 16/122,611, dated Sep. 18, 2020, 17 pages.
Final Office Action for U.S. Appl. No. 16/174,535, dated Jul. 1, 2020, 7 pages.
Notice of Allowance for U.S. Appl. No. 16/246,859, dated Sep. 18, 2020, 8 pages.
Non-Final Office Action for U.S. Appl. No. 16/284,023, dated Jun. 24, 2020, 7 pages.
Quayle Action for U.S. Appl. No. 16/421,905, dated Aug. 25, 2020, 5 pages.
Non-Final Office Action for U.S. Appl. No. 16/435,940, dated Jul. 23, 2020, 6 pages.
Non-Final Office Action for U.S. Appl. No. 16/774,060, dated Aug. 17, 2020, 6 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/590,790, dated Jan. 27, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.

\* cited by examiner

ENVELOPE TRACKING INTEGRATED CIRCUIT AND RELATED APPARATUS

RELATED APPLICATIONS

This application claims the benefit of provisional patent application Ser. No. 62/842,486, filed May 2, 2019, the disclosure of which is hereby incorporated herein by reference in its entirety.

FIELD OF THE DISCLOSURE

The technology of the disclosure relates generally to an envelope tracking (ET) radio frequency (RF) power amplifier apparatus.

BACKGROUND

Mobile communication devices, such as smartphones, have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience has also led to the rise of so-called wearable devices, such as smartwatches. Over time, the wearable devices have evolved from simple companion devices to the mobile communication devices into full-fledged multi-functional wireless communication devices. Nowadays, most of the wearable electronic devices are often equipped with digital and analog circuitries capable of communicating a radio frequency (RF) signal(s) in a variety of wireless communication systems, such as long-term evolution (LTE), Wi-Fi, Bluetooth, and so on. Like mobile communication devices, wearable devices often employ sophisticated power amplifiers to amplify the RF signal(s) to help improve coverage range, data throughput, and reliability of the wearable devices.

Envelope tracking (ET) is a power management technology designed to improve efficiency levels of the power amplifiers. In this regard, it may be desirable to employ ET across the variety of wireless communication technologies to help reduce power consumption and thermal dissipation in the wearable devices. Notably, the RF signal(s) communicated in different wireless communication systems may correspond to different modulation bandwidths (e.g., from 80 KHz to over 200 MHz). Further, the power amplifiers can be associated with different load-line impedances and/or subject to different voltage standing wave ratios (VSWRs), which measure how efficiently the power amplifiers can transfer the RF signal to a load (e.g., an antenna). As such, it may be desirable to ensure that the power amplifiers can maintain optimal efficiency across a wide range of modulation bandwidth and in face of different load-line impedances.

SUMMARY

Embodiments of the disclosure relate to an envelope tracking (ET) integrated circuit (IC) (ETIC). The ETIC is configured to generate an ET voltage based on a supply voltage(s) and provide the ET voltage to an amplifier circuit(s) for amplifying a radio frequency (RF) signal(s). Notably, the RF signal(s) may be modulated in different modulation bandwidths and the amplifier circuit(s) may correspond to different load-line impedances. Accordingly, the ETIC may need to adapt the ET voltage such that the ETIC and the amplifier circuit(s) can operate at higher efficiencies. In examples discussed herein, the ETIC is configured to determine a time-variant peak of the ET voltage and adjust the supply voltage(s) accordingly. As a result, it may be possible to improve operating efficiency of the ETIC in face of a wide range of bandwidth and/or load-line requirements.

In one aspect, an ETIC is provided. The ETIC includes an ET voltage circuit configured to generate an ET voltage based on at least one supply voltage. The ETIC also includes a supply voltage circuit configured to generate the at least one supply voltage based on at least one supply target voltage. The ETIC also includes a control circuit. The control circuit is configured to determine a peak of the ET voltage. The control circuit is also configured to adjust the at least one supply target voltage based on the determined peak of the ET voltage to cause the supply voltage circuit to adjust the at least one supply voltage.

In another aspect, an ET apparatus is provided. The ET apparatus includes an ETIC. The ETIC includes an ET voltage circuit configured to generate an ET voltage based on at least one supply voltage. The ETIC also includes a supply voltage circuit configured to generate the at least one supply voltage based on at least one supply target voltage. The ETIC also includes a control circuit. The control circuit is configured to determine a peak of the ET voltage. The control circuit is also configured to adjust the at least one supply target voltage based on the determined peak of the ET voltage to cause the supply voltage circuit to adjust the at least one supply voltage. The ET apparatus also includes a transceiver circuit coupled to the ETIC.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) integrated circuit (IC) (ETIC). The ETIC is configured to generate an ET voltage based on a supply voltage(s) and provide the ET voltage to an amplifier circuit(s) for amplifying a radio frequency (RF) signal(s). Notably, the RF signal(s) may be modulated in different modulation bandwidths and the amplifier circuit(s) may correspond to different load-line impedances. Accordingly, the ETIC may need to adapt the ET voltage such that the ETIC and the amplifier circuit(s) can operate at higher efficiencies. In examples discussed herein, the ETIC is configured to determine a time-variant peak of the ET voltage and adjust the supply voltage(s) accordingly. As a result, it may be possible to improve operating efficiency of the ETIC in face of a wide range of bandwidth and/or load-line requirements.

Figure 1:
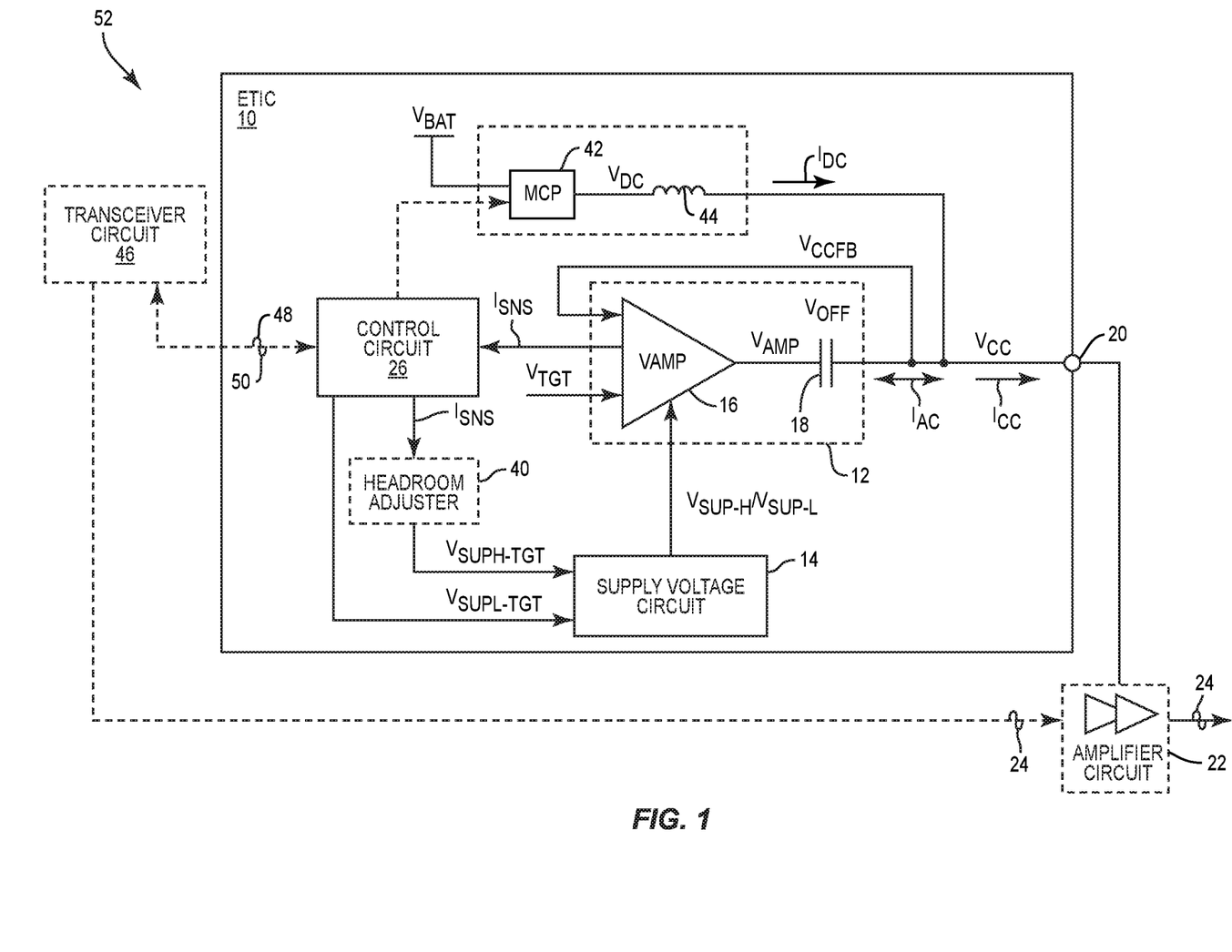
FIG. 1 is a schematic diagram of an exemplary ETIC configured according to an embodiment of the present disclosure to maintain a higher operating efficiency in face of a wide range of bandwidth and/or load-line requirements

In this regard, FIG. 1 is a schematic diagram of an exemplary ETIC 10 configured according to an embodiment of the present disclosure to maintain a higher operating efficiency in face of a wide range of bandwidth and/or load-line requirements. The ETIC 10 includes an ET voltage circuit 12 configured to generate an ET voltage $V_{CC}$ based on a lower supply voltage $V_{SUP-L}$ or a higher supply voltage $V_{SUP-H}$ (collectively referred to as "at least one supply voltage"). The ETIC 10 also includes a supply voltage circuit 14 configured to generate the lower supply voltage $V_{SUP-L}$ or the higher supply voltage $V_{SUP-H}$. The supply voltage circuit 14 may be configured to receive a lower supply target voltage $V_{SUPPL-TGT}$ or a higher supply target voltage $V_{SUPH-TGT}$ (collectively referred to as "at least one supply target voltage"). In a non-limiting example, the supply voltage circuit 14 can be configured to generate the lower supply voltage $V_{SUP-L}$ in response to receiving the lower supply target voltage $V_{SUPL-TGT}$ and generate the higher supply voltage $V_{SUP-H}$ in response to receiving the higher supply target voltage $V_{SUPH-TGT}$. In this regard, the lower supply voltage $V_{SUP-L}$ may be proportionally related to the lower supply target voltage $V_{SUPL-TGT}$ and the higher supply voltage $V_{SUP-H}$ may be proportionally related to the higher supply target voltage $V_{SUPH-TGT}$. As such, it may be possible to cause an adjustment in the lower supply voltage $V_{SUP-L}$ by adjusting the lower supply target voltage $V_{SUPL-TGT}$. Likewise, it may be possible to cause an adjustment in the higher supply voltage $V_{SUP-H}$ by adjusting the higher supply target voltage $V_{SUPH-TGT}$.

In a non-limiting example, the ET voltage circuit 12 includes a voltage amplifier 16 and an offset capacitor 18. The voltage amplifier 16 is configured to generate an initial ET voltage $V_{AMP}$ based on the lower supply voltage $V_{SUP-L}$ or the higher supply voltage $V_{SUP-H}$. The offset capacitor 18 may be configured to raise the initial ET voltage $V_{AMP}$ by an offset voltage $V_{OFF}$ (e.g., 0.8 V) to generate the ET voltage $V_{CC}$ at an output port 20 ($V_{CC}=V_{AMP}+V_{OFF}$). By employing the offset capacitor 18 to raise the initial ET voltage $V_{AMP}$, it may be possible to ease the burden of the voltage amplifier 16 when the ET voltage approaches a peak, thus making it possible to improve operating efficiency of the voltage amplifier 16.

The ETIC 10 may be coupled to an amplifier circuit 22 configured to amplify an RF signal 24 based on the ET voltage $V_{CC}$. Notably, the amplifier circuit 22 may exhibit different load-line impedances to the ETIC 10 and the RF signal 24 may correspond to different modulation bandwidths. As such, the ETIC 10 may be required to adapt the ET voltage $V_{CC}$ accordingly to help improve operating efficiency of the amplifier circuit 22.

In a non-limiting example, the supply voltage circuit 14 is configured to provide the higher supply voltage $V_{SUP-H}$ to the voltage amplifier 16 to help avoid amplitude clipping when the ET voltage is near the peak. Alternatively, the supply voltage circuit 14 may be configured to provide the lower supply voltage $V_{SUP-L}$ to the voltage amplifier 16 to help improve operating efficiency of the voltage amplifier 16 when the ET voltage is close to an average. Typically, the voltage amplifier 16 will be more efficient when operating based on the lower supply voltage $V_{SUP-L}$ than operating based on the higher supply voltage $V_{SUP-H}$. Given that the voltage amplifier is less efficient when operating based on the higher supply voltage $V_{SUP-H}$, it may be desirable to improve overall efficiency of the voltage amplifier 16 at the higher supply voltage $V_{SUP-H}$.

In this regard, the ETIC 10 is further configured to include a control circuit 26, which can be a microprocessor, a microcontroller, or a field-programmable gate array (FPGA), as an example. In examples discussed herein, the control circuit 26 is configured to determine the peak of the ET voltage $V_{CC}$, for example on a periodic basis. Accordingly, the control circuit 26 can be configured to dynamically adjust the higher supply target voltage $V_{SUPH-TGT}$ based on the determined peak of the ET voltage $V_{CC}$ to cause the supply voltage circuit 14 to adjust the higher supply voltage $V_{SUP-H}$. As such, it may be possible to opportunistically adapt the higher supply voltage $V_{SUP-H}$ when the ET voltage $V_{CC}$ is at or near the peak, thus making it possible to improve overall operating efficiency of the voltage amplifier 16 in face of the wide range of modulation bandwidths and/or load-line impedances.

Figure 2A:
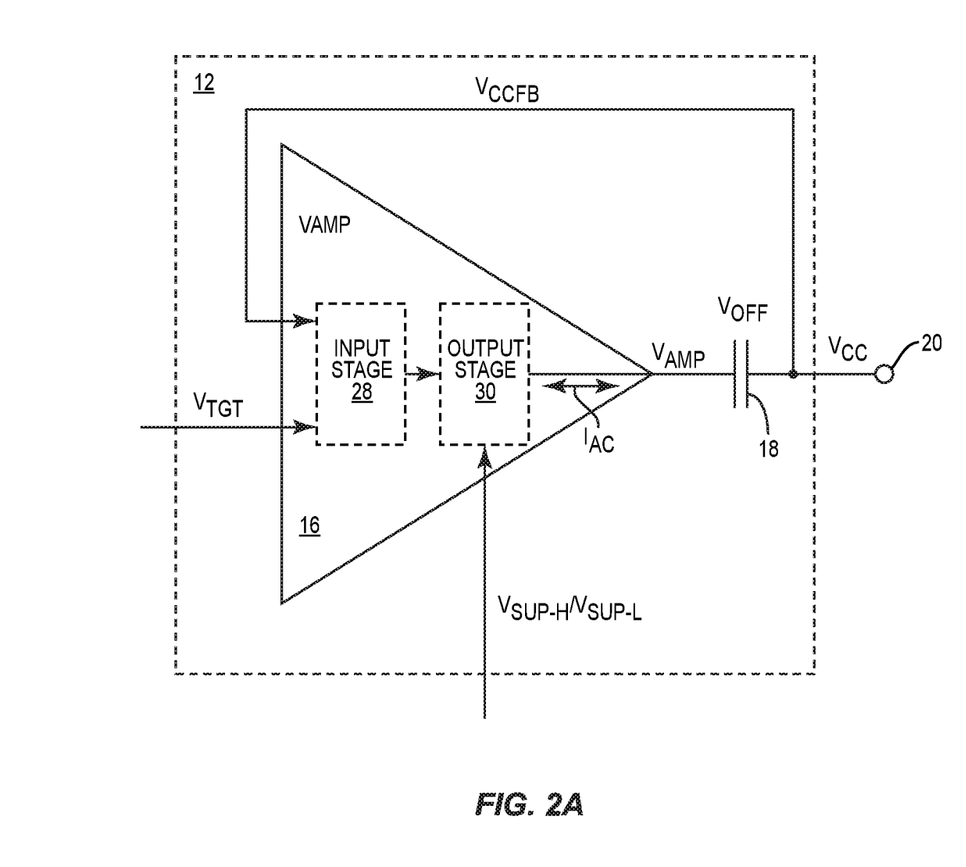
FIG. 2A is a schematic diagram providing an exemplary illustration of a voltage amplifier in the ETIC of FIG. 1.

To help understand how the control circuit 26 can influence the higher supply voltage $V_{SUP-H}$, it may be necessary to further explain the inner structure of the voltage amplifier 16 in the ET voltage circuit 12. In this regard, FIG. 2A is a schematic diagram providing an exemplary illustration of the voltage amplifier 16 in the ETIC 10 of FIG. 1. Common elements between FIGS. 1 and 2A are shown therein with common element numbers and will not be re-described herein.

The voltage amplifier 16 includes at least one input stage 28 and at least one output stage 30. The input stage 28 may be configured to receive an ET target voltage $V_{TGT}$ and the output stage 30 is configured to receive the lower supply voltage $V_{SUP-L}$ or the higher supply voltage $V_{SUP-H}$. Collectively, the input stage 28 and the output stage 30 cause the voltage amplifier 16 to generate the initial ET voltage $V_{AMP}$ based on the ET target voltage $V_{TGT}$ and one of the lower supply voltage $V_{SUP-L}$ and the higher supply voltage $V_{SUP-H}$. The input stage 28 may be further configured to receive a feedback voltage $V_{CCFB}$, which is proportional to the ET voltage $V_{CC}$, such that the ET voltage circuit 12 can generate the ET voltage $V_{CC}$ based on a closed-loop envelope tracking mechanism. In addition to generating the initial ET voltage VAMP, the voltage amplifier 16 may also source or sink a high-frequency current $1_{AC}$ (e.g., an alternating current) depending on the modulation bandwidth of the RF signal 24.

Figure 2B:
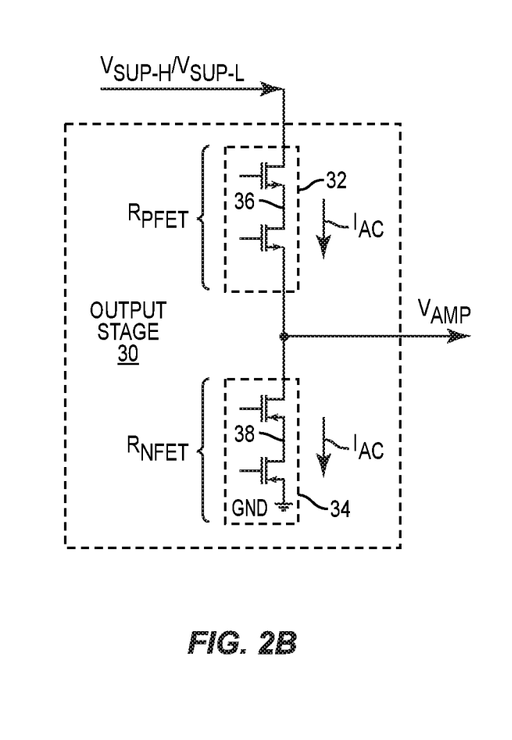
FIG. 2B is a schematic diagram providing an exemplary illustration of an output stage in the voltage amplifier of FIG. 2A.

FIG. 2B is a schematic diagram providing an exemplary illustration of the output stage 30 in the voltage amplifier 16 of FIG. 2A. Common elements between FIGS. 2A and 2B are shown therein with common element numbers and will not be re-described herein.

In a non-limiting example, the output stage 30 includes a p-type field-effect transistor (PFET) stack 32 and an n-type field-effect transistor (NFET) stack 34. The PFET stack 32 may include at least one PFET 36 and corresponds to an equivalent resistance $R_{PFET}$. The NFET stack 34 may include at least one NFET 38 and corresponds to an equivalent resistance $R_{NFET}$. The PFET stack 32 may be coupled to the supply voltage circuit 14 to receive the lower supply voltage $V_{SUP-L}$ or the higher supply voltage $V_{SUP-H}$. In addition, the PFET stack 32 may be configured to source the high-frequency current $1_{AC}$, for example, when the RF signal 24 exhibits a higher peak-to-average ratio (PAR). The NFET stack 34 may be coupled between the PFET stack 32 and a ground (GND). The NFET stack 34 may be configured to sink the high-frequency current $1_{AC}$, for example, when the RF signal 24 exhibits a lower PAR.

With reference back to FIG. 1, the supply voltage circuit 14 may be configured to generate the higher supply voltage $V_{SUP-H}$ based on the equation (Eq. 1) below.

$$V_{SUP-H}=V_{CC-MAX}-V_{OFF}+P_{headroom} \qquad (\text{Eq. 1})$$

In the equation (Eq. 1) above, $V_{CC-MAX}$ represents the peak of the ET voltage $V_{CC}$ and $P_{headroom}$ represents a defined headroom voltage corresponding to the PAR of the RF signal 24. In this regard, it may be possible to adjust the higher supply voltage $V_{SUP-H}$ by adjusting the $P_{headroom}$, which may be further determined based on the equation (Eq. 2) below.

$$P_{headroom}=R_{PFET}*I_{AC-MAX} \qquad (\text{Eq. 2})$$

In the equation (Eq. 2) above, $R_{PFET}$ represents the equivalent resistance of the PFET stack 32 in the output stage 30 of the voltage amplifier 16. $I_{AC-MAX}$ represents a peak of the high-frequency current $1_{AC}$, which typically coincides with the peak of the ET voltage $V_{CC}$, sourced by the voltage amplifier 16. In this regard, to effectively control the higher supply voltage $V_{SUP-H}$ on an ongoing basis to improve the operating efficiency near the peak of the ET voltage $V_{CC}$, the control circuit 26 may be configured to periodically determine a headroom voltage variation $\Delta P_{headroom}$ relative to the defined headroom voltage $P_{headroom}$. Accordingly, the control circuit 26 may adjust the higher supply target voltage $V_{SUPH-TGT}$ to cause the supply voltage circuit 14 to adjust the higher supply voltage $V_{SUP-H}$. In a non-limiting example, the control circuit 26 can determine the headroom voltage variation $\Delta P_{headroom}$ based on the equation (Eq. 3) below.

$$\Delta P_{headroom}=R_{PFET}*(I_{AC-MAX-REF}-I_{AC-MAX}) \qquad (\text{Eq. 3})$$

In the equation (Eq. 3) above, $I_{AC-MAX-REF}$ represents the peak of the high-frequency current $1_{AC}$ corresponding to the defined headroom voltage $P_{headroom}$ and $I_{AC-MAX}$ represents a presently determined peak of the high-frequency current $I_{AC}$ corresponding to a presently determined peak of the ET voltage $V_{CC}$. In a non-limiting example, $I_{AC-MAX-REF}$ corresponds to the peak of the high-frequency current $1_{AC}$ in a first duration and $1_{AC-MAX}$ corresponds to the peak of the high-frequency current $1_{AC}$ in a second duration succeeding the first duration, as illustrated in FIG. 3.

Figure 3:
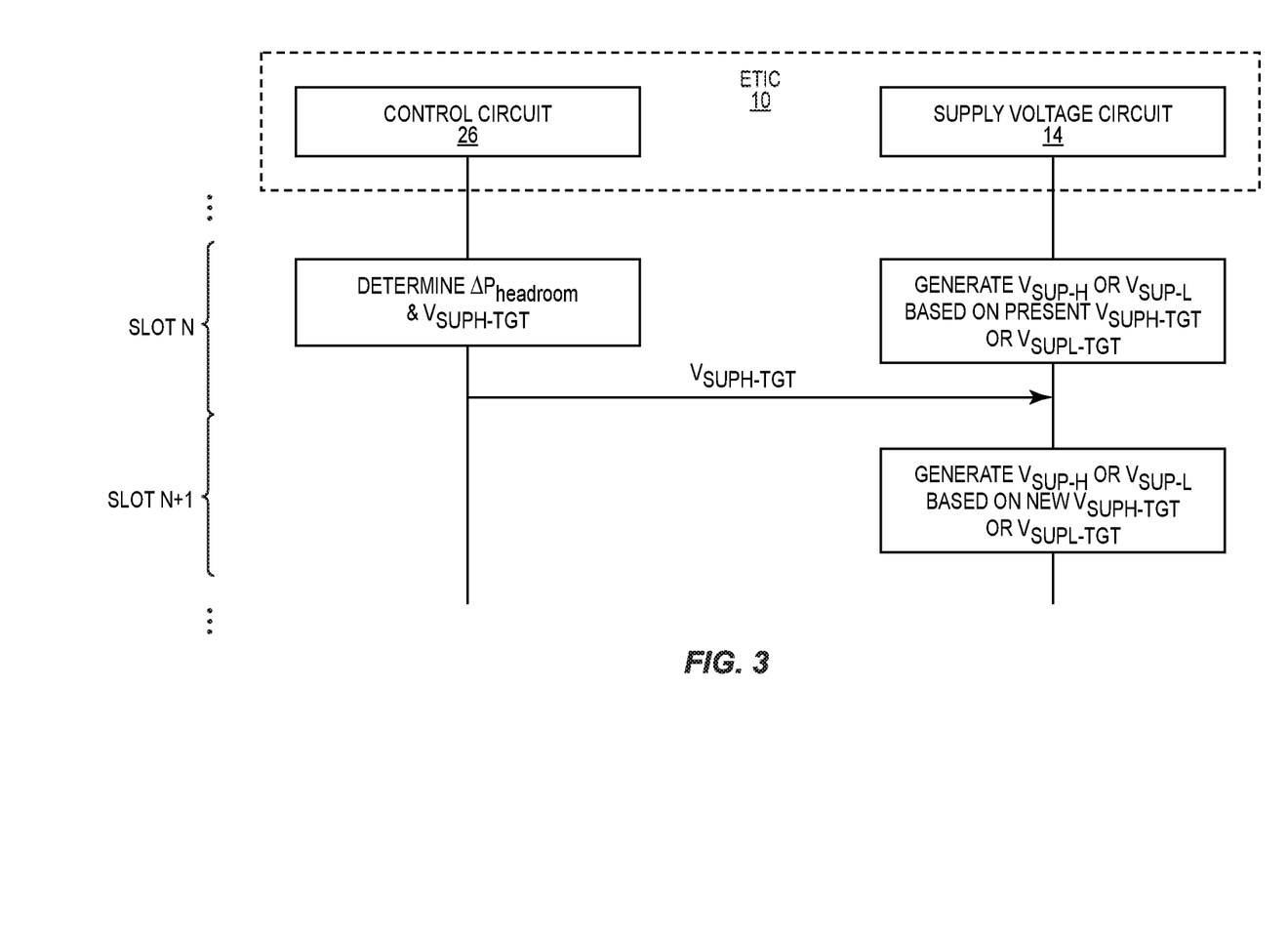
FIG. 3 is a graphic diagram providing an exemplary illustration of the ETIC of FIG. 1 configured to maintain the higher operating efficiency on a periodic basis.

In this regard, FIG. 3 is a graphic diagram providing an exemplary illustration of the ETIC 10 of FIG. 1 configured to maintain the higher operating efficiency on a periodic basis. In a non-limiting example, the first duration and the second duration can correspond to a timeslot N and a timeslot N+1, among a number of continuous timeslots. In this regard, $I_{AC-MAX-REF}$ corresponds to the peak of the high-frequency current $1_{AC}$ in the timeslot N and $I_{AC-MAX}$ corresponds to the peak of the high-frequency current $I_{AC}$ in the timeslot N+1, which immediately succeeds the timeslot N.

During the timeslot N, the control circuit 26 may determine the headroom voltage variation $\Delta P_{headroom}$. The control circuit 26 may determine the higher supply target voltage $V_{SUPH-TGT}$ based on the headroom voltage variation $\Delta P_{headroom}$. The control circuit 26 may subsequently provide the updated higher supply target voltage $V_{SUPH-TGT}$ to the supply voltage circuit 14. Accordingly, the supply voltage circuit 14 may generate the updated higher supply voltage $V_{SUP-H}$ in the succeeding timeslot N+1. By effectuating the updated higher supply voltage $V_{SUP-H}$ in the succeeding timeslot N+1, as opposed to the present timeslot N, it may be possible to avoid unintended disruption to the voltage amplifier 16.

With reference back to FIG. 1, the voltage amplifier 16 may be configured to generate a sense current $I_{SNS}$ that is proportionally related to the high-frequency current $I_{AC}$ sourced by the voltage amplifier 16. In this regard, the control circuit 26 may be configured to determine the peak of the high-frequency current $I_{AC-MAX}$, and thus the headroom voltage variation $\Delta P_{headroom}$, based on the sense current $I_{SNS}$.

The ETIC 10 may be configured to include a headroom adjuster 40 coupled between the control circuit 26 and the supply voltage circuit 14. In a non-limiting example, the headroom adjuster 40 can be configured to determine the headroom voltage variation $\Delta P_{headroom}$ based on the sense current $I_{SNS}$. Accordingly, the headroom adjuster 40 may adjust the higher supply target voltage $V_{SUPH-TGT}$ based on the headroom voltage variation $\Delta P_{headroom}$ to cause the supply voltage circuit 14 to adjust the higher supply voltage $V_{SUP-H}$.

The ETIC 10 can be further configured to include a multi-level charge pump (MCP) 42 and a power inductor 44. The MCP 42 may be configured to generate a low-frequency voltage $V_{DC}$ (e.g., a constant voltage) based on a battery voltage $V_{BAT}$. The power inductor 44 may be configured to induce a low-frequency current $I_{DC}$ (e.g., a direct current) based on the low-frequency voltage $V_{DC}$. The power inductor 44 may be coupled to the output port 20 to provide the low-frequency current $I_{DC}$ to the output port 20. In this regard, the amplifier circuit 22 receives an ET current $I_{CC}$ from the output port 20 that is a combination of the low-frequency current $I_{DC}$ generated by the power inductor 44 and the high-frequency current $I_{AC}$ sourced by the voltage amplifier 16 ($I_{CC}=I_{DC}+I_{AC}$).

The ETIC 10 may be coupled to a transceiver circuit 46, which is configured to generate and provide the RF signal 24 to the amplifier circuit 22. In an alternative embodiment, the transceiver circuit 46 may be configured to generate and provide the lower supply target voltage $V_{SUPL-TGT}$ and/or the higher supply target voltage $V_{SUPH-TGT}$ to the supply voltage circuit 14. In this regard, the control circuit 26 can be configured to provide the headroom voltage variation $\Delta P_{headroom}$ (e.g., via an indication signal 48) to the transceiver circuit 46. Accordingly, the transceiver circuit 46 may adjust the higher supply target voltage $V_{SUPH-TGT}$ to cause the supply voltage circuit 14 to adjust the higher supply voltage $V_{SUP-H}$.

As mentioned earlier in FIG. 3, the ETIC 10 may be configured to effectuate the updated higher supply voltage $V_{SUP-H}$ in the succeeding timeslot N+1, as opposed to the present timeslot N, to avoid unintended disruption to the voltage amplifier 16. In this regard, the transceiver circuit 46 may be configured to provide a boundary indication signal 50 configured to indicate the boundary between the timeslot N and the timeslot N+1. In a non-limiting example, the ETIC 10, the amplifier circuit 22, and the transceiver circuit 46 may be integrated into an ET apparatus 52.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) integrated circuit (IC) (ETIC) comprising:
   an ET voltage circuit configured to generate an ET voltage based on at least one supply voltage;
   a supply voltage circuit configured to generate the at least one supply voltage based on at least one supply target voltage; and
   a control circuit configured to:
      determine a peak of the ET voltage; and
      adjust the at least one supply target voltage based on the determined peak of the ET voltage to cause the supply voltage circuit to adjust the at least one supply voltage.

2. The ETIC of claim 1 wherein the control circuit is further configured to:
   determine the peak of the ET voltage in a first duration; and
   adjust the at least one supply target voltage based on the determined peak of the ET voltage to cause the supply voltage circuit to adjust the at least one supply voltage in a second duration succeeding the first duration.

3. The ETIC of claim 1 wherein the ET voltage circuit comprises:
   a voltage amplifier comprising an input stage and an output stage and configured to generate an initial ET voltage based on the at least one supply voltage; and
   an offset capacitor configured to raise the initial ET voltage by an offset voltage to generate the ET voltage.

4. The ETIC of claim 3 wherein the supply voltage circuit is further configured to:
   receive the at least one supply target voltage comprising a lower supply target voltage and a higher supply target voltage higher than the lower supply target voltage; and
   generate the at least one supply voltage comprising a lower supply voltage corresponding to the lower supply target voltage and a higher supply voltage corresponding to the higher supply target voltage, wherein the higher supply voltage is higher than the lower supply voltage.

5. The ETIC of claim 4 wherein the supply voltage circuit is further configured to generate the lower supply voltage and the higher supply voltage in response to receiving the lower supply target voltage and the higher supply target voltage, respectively.

6. The ETIC of claim 4 wherein the higher supply voltage is equal to $V_{CC-MAX}-V_{OFF}+P_{headroom}$, wherein:
   $V_{CC-MAX}$ represents the peak of the ET voltage;
   $V_{OFF}$ represents the offset voltage; and
   $P_{headroom}$ represents a defined headroom voltage corresponding to the output stage of the voltage amplifier.

7. The ETIC of claim 6 wherein the defined headroom voltage is equal to $R_{PFET}*I_{AC-MAX}$, wherein:
   $R_{PFET}$ represents an equivalent resistance of a p-type field-effect transistor (PFET) stack in the output stage of the voltage amplifier; and
   $I_{AC-MAX}$ represents a peak high-frequency current corresponding to the peak of the ET voltage sourced by the voltage amplifier.

8. The ETIC of claim 7 wherein the voltage amplifier is further configured to generate a sense current proportionally related to the peak high-frequency current sourced by the voltage amplifier.

9. The ETIC of claim 8 wherein the control circuit is further configured to:
receive the sense current from the voltage amplifier;
determine a headroom voltage variation based on the sense current; and
adjust the at least one supply target voltage based on the headroom voltage variation to cause the supply voltage circuit to adjust the at least one supply voltage.

10. The ETIC of claim 9 further comprising a headroom adjuster coupled to the control circuit and configured to:
determine the headroom voltage variation based on the sense current; and
adjust the at least one supply target voltage based on the headroom voltage variation to cause the supply voltage circuit to adjust the at least one supply voltage.

11. An envelope tracking (ET) apparatus comprising:
an ET integrated circuit (IC) (ETIC) comprising:
an ET voltage circuit configured to generate an ET voltage based on at least one supply voltage;
a supply voltage circuit configured to generate the at least one supply voltage based on at least one supply target voltage; and
a control circuit configured to:
determine a peak of the ET voltage; and
adjust the at least one supply target voltage based on the determined peak of the ET voltage to cause the supply voltage circuit to adjust the at least one supply voltage; and
a transceiver circuit coupled to the ETIC.

12. The ET apparatus of claim 11 wherein the control circuit is further configured to:
determine the peak of the ET voltage in a first duration; and
adjust the at least one supply target voltage based on the determined peak of the ET voltage to cause the supply voltage circuit to adjust the at least one supply voltage in a second duration succeeding the first duration.

13. The ET apparatus of claim 11 wherein the ET voltage circuit comprises:
a voltage amplifier comprising an input stage and an output stage and configured to generate an initial ET voltage based on the at least one supply voltage; and
an offset capacitor configured to raise the initial ET voltage by an offset voltage to generate the ET voltage.

14. The ET apparatus of claim 13 wherein the supply voltage circuit is further configured to:
receive the at least one supply target voltage comprising a lower supply target voltage and a higher supply target voltage higher than the lower supply target voltage; and
generate the at least one supply voltage comprising a lower supply voltage corresponding to the lower supply target voltage and a higher supply voltage corresponding to the higher supply target voltage, wherein the higher supply voltage is higher than the lower supply voltage.

15. The ET apparatus of claim 14 wherein the supply voltage circuit is further configured to generate the lower supply voltage and the higher supply voltage in response to receiving the lower supply target voltage and the higher supply target voltage, respectively.

16. The ET apparatus of claim 14 wherein the higher supply voltage is equal to $V_{CC-MAX} - V_{OFF} + P_{headroom}$, wherein:
$V_{CC-MAX}$ represents the peak of the ET voltage;
$V_{OFF}$ represents the offset voltage; and
$P_{headroom}$ represents a defined headroom voltage corresponding to the output stage of the voltage amplifier.

17. The ET apparatus of claim 16 wherein the defined headroom voltage is equal to $R_{PFET} * I_{AC-MAX}$, wherein:
$R_{PFET}$ represents an equivalent resistance of a p-type field-effect transistor (PFET) stack in the output stage of the voltage amplifier; and
$I_{AC-MAX}$ represents a peak high-frequency current corresponding to the peak of the ET voltage sourced by the voltage amplifier.

18. The ET apparatus of claim 17 wherein the voltage amplifier is further configured to generate a sense current proportionally related to the peak high-frequency current sourced by the voltage amplifier.

19. The ET apparatus of claim 18 wherein the control circuit is further configured to:
receive the sense current from the voltage amplifier;
determine a headroom voltage variation based on the sense current; and
adjust the at least one supply target voltage based on the headroom voltage variation to cause the supply voltage circuit to adjust the at least one supply voltage.

20. The ET apparatus of claim 19 wherein:
the control circuit is further configured to provide the determined headroom voltage variation to the transceiver circuit; and
the transceiver circuit is further configured to adjust the at least one supply target voltage based on the headroom voltage variation to cause the supply voltage circuit to adjust the at least one supply voltage.

* * * * *